United States Patent
Bao et al.

(10) Patent No.: US 7,361,057 B1
(45) Date of Patent: Apr. 22, 2008

(54) METHOD AND APPARATUS FOR SOLDERING OPTION OF A HIGHLY INTEGRATED MINIATURIZED FORM FACTOR CARD

(75) Inventors: Shanquan Bao, Alameda, CA (US); Taojin Le, Hangzhou (CN); Hongqi Wu, Chengdu (CN)

(73) Assignee: UTStarcom, Inc., Alameda, CA (US)

( * ) Notice: Subject to any disclaimer, the term of this patent is extended or adjusted under 35 U.S.C. 154(b) by 0 days.

(21) Appl. No.: 11/670,551

(22) Filed: Feb. 2, 2007

(51) Int. Cl.
*H01R 24/00* (2006.01)
(52) U.S. Cl. .................. 439/630; 439/83; 439/946
(58) Field of Classification Search ............. 439/630, 439/629, 632, 633, 636, 946, 951
See application file for complete search history.

(56) References Cited

U.S. PATENT DOCUMENTS 6,293,464 B1 * 9/2001 Smalley, Jr. ............... 235/451
6,471,550 B2 * 10/2002 Maiterth et al. ........... 439/631
6,690,947 B1    2/2004 Tom
6,719,570 B2 *  4/2004 Tsuchioka ................. 439/76.1
2007/0103876 A1 5/2007 Huang

* cited by examiner

*Primary Examiner*—Hae M Hyeon

(57) ABSTRACT

A connector system for a miniaturized form factor card allows a communications system for mobile information devices having an applications processor and user interface components. A receiving frame is provided in the mobile information device for an insertable miniaturized form factor card incorporating means for RF transmission and reception and a wireless modem. A connector moiety on the card is received in a mating moiety in the receiving frame. The miniaturized form factor card also incorporates an array of solder pads for alternative permanent engagement of a mating array of solder pads on a printed circuit board in an alternative mobile information device. The applications processor and the user interface components in the mobile information device are interconnected to digital functions of the wireless modem and means for RF transmission and reception through the connector or, alternatively, the solder pad array.

15 Claims, 10 Drawing Sheets

METHOD AND APPARATUS FOR SOLDERING OPTION OF A HIGHLY INTEGRATED MINIATURIZED FORM FACTOR CARD

REFERENCE TO RELATED APPLICATIONS

This application is related to copending U.S. application Ser. No. 11/308,221 filed on Mar. 13, 2006 entitled MINIATURIZED FORM FACTOR WIRELESS COMMUNICATIONS CARD FOR GENERIC MOBILE INFORMATION DEVICES, and having the same assignee as the present application which is incorporated herein by reference in its entirety as though fully set forth.

BACKGROUND OF THE INVENTION

1. Field of the Invention

This invention relates generally to the field of operating platforms for mobile phones and personal data systems and more particularly to an optional solder connector system for permanent installation to be employed with generic mobile information devices for a wireless communications card with a miniaturized form factor which is insertable into the mobile information devices to accommodate desired wireless communication functions.

2. Related Art

Current design time-to-market for mobile phone and personal information devices is extended due to current design philosophy and practice. Turn-around time for a typical complete handset design is about 9 months. Currently terminal vendors need to spend significant amount of resources on basic wireless communication functions and cannot concentrate on truly value-added design works, such as industrial design and software applications. It is also difficult to develop multiple models with significant differences based on a common printed circuit board (PCB) platform. Traditional wireless devices using discrete solution have difficulty supporting multiple band or modes such as GSM, CDMA, 3G. Discrete chipset solutions consume at least three times more PCB space. There are significant financial and technical barriers of entry for new companies without significant resources, or established companies without wireless expertise.

Currently there are some vendors selling modules that can provide wireless communication functions in a particular wireless technology. However these modules are large in size with proprietary interfaces. These modules require significant amount of vendor integration. Alternatively, certain prior art systems are simply modularizing wireless modem functions. Prior art systems for removable cartridges providing communications elements such as that disclosed in U.S. Pat. No. 6,690,947 to Tom provide some flexibility in applications design; however, such systems were bulky and lacked packaging and connector innovations required for practical application of such systems.

U.S. patent application Ser. No. 11/308,221 filed on Mar. 13, 2006 entitled MINIATURIZED FORM FACTOR WIRELESS COMMUNICATIONS CARD FOR GENERIC MOBILE INFORMATION DEVICES provides a system that can save RF tuning, debugging and certification thereby reducing design lead time significantly. This system provides the ability to integrate hardware, software, utilities and drivers which will allow true plug and play functionality for end users or mobile information device design houses. The desired functional capability is provided through an insertable card to eliminate the requirement for a separate CPU or applications processor in the mobile information device and additionally, provides a complete modem solution that will support multi-mode and multi-band.

To enhance the space savings and weight reduction to permit more compact portable devices and flexible designs and integrate chipset and passive components into a common module, it is desirable to provide a connection system for the insertable card having standard interfaces for mating to PC boards within the mobile information device platforms and allowing optional permanent connection into the MID. To further enhance the connector in such a common module it is desirable that the interface system incorporate integral alignment systems for accurate placement of the miniature form factor card within the MID and retain the capability for use with a removable connector system on the printed circuit board in the generic mobile information devices.

SUMMARY OF THE INVENTION

The present invention provides a connector arrangement for a wireless communications card for mobile information devices with user interface components. A receiving frame is mounted on a printed circuit board in the mobile information device to receive an insertable miniaturized form factor card incorporating means for RF transmission and reception and a wireless modem. The receiving frame incorporates alignment elements and an indexing connector moiety with a plurality of conductive contact pads is present on the card which is received in a mating moiety in the receiving frame. The card incorporates a set of alignment elements for engagement with a set of mating alignment elements in the frame. The frame also incorporates a receiving element for an elastomeric connector providing the mating connector moiety. A plurality of solder pads are provided for alternate interconnection of the mobile information device functions to a printed circuit board in the mobile information device. An alignment element for engagement of a mating alignment element on the PC board is provided for proper mating of the solder pads on the PC board and card. Bus interconnection for the solder pads and related connector moiety contact pads is provided in the card for use of either interconnection system without modification of the card. The applications processor, the user interface components, or both in the mobile information device are interconnected to digital functions of the wireless modem and means for RF transmission and reception through the solder connection or the connector as selected by the user/manufacturer.

BRIEF DESCRIPTION OF THE DRAWINGS

These and other features and advantages of the present invention will be better understood by reference to the following detailed description when considered in connection with the accompanying drawings wherein.

DETAILED DESCRIPTION OF THE INVENTION

Figure 1A:
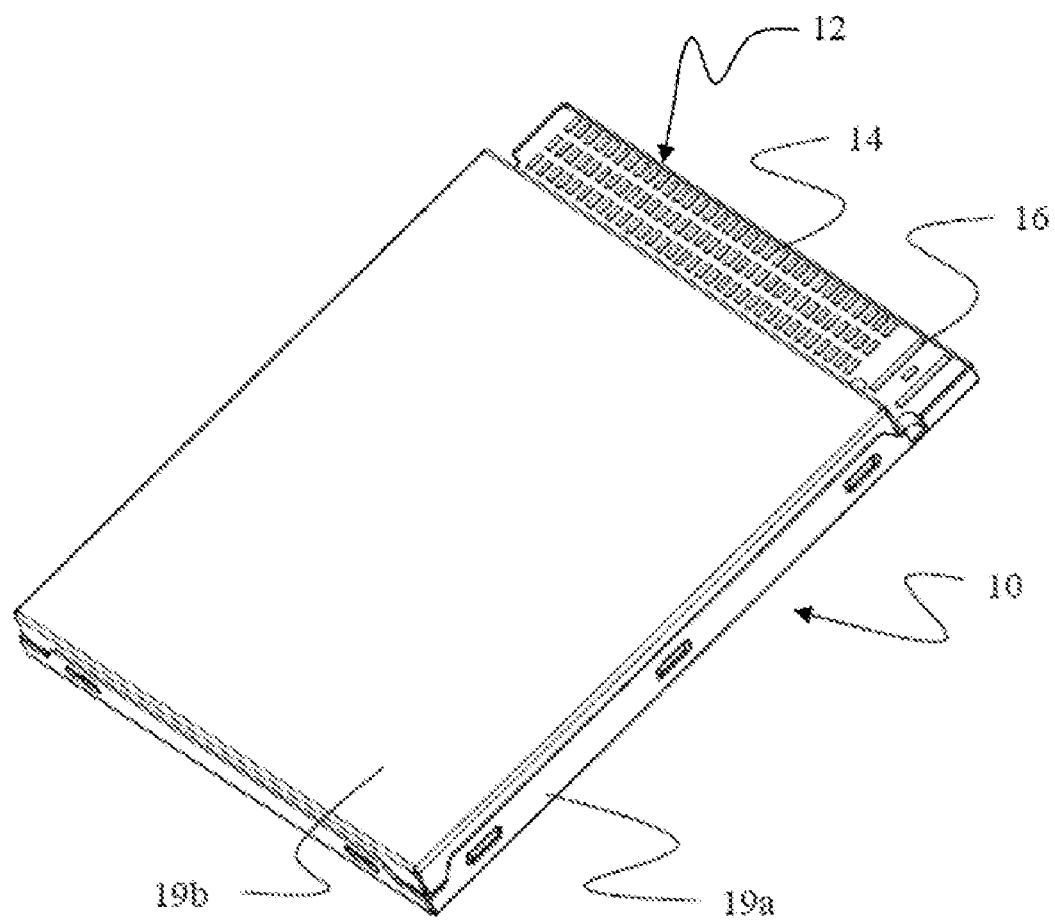
FIGS. 1A-1B are isometric top and bottom views of a miniaturized form factor card with case installed as employed in a connector system according to the present invention and an exemplary mobile information device.
Figure 1B:
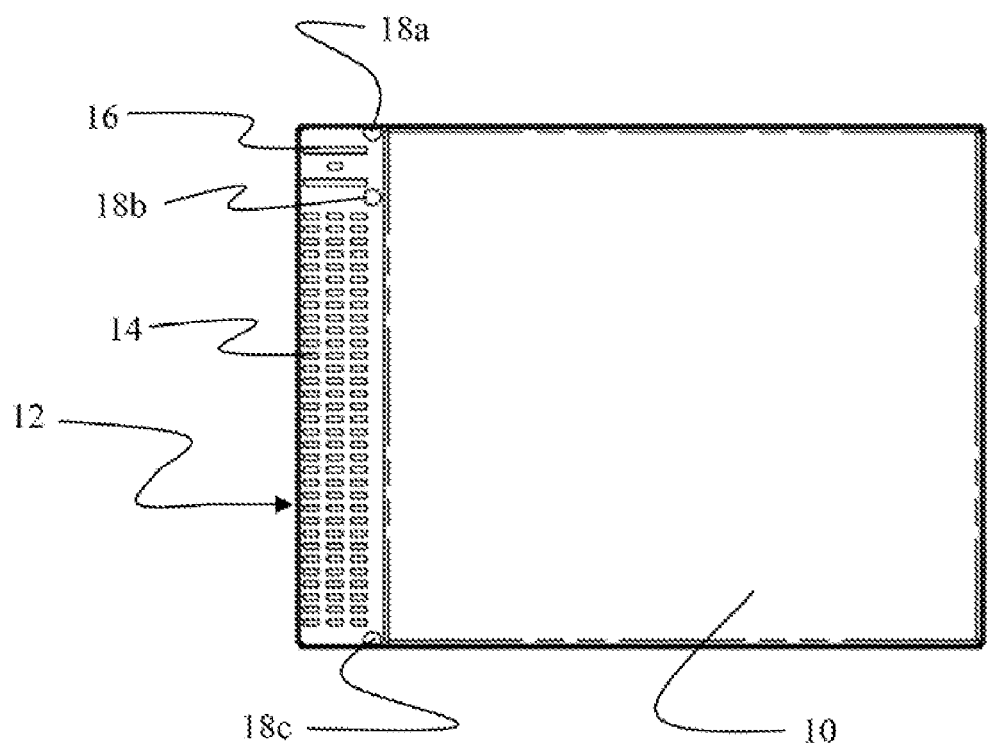

FIGS. 1A and 1B demonstrates one embodiment of a miniaturized form factor card 10 employed with a connector system according to the invention. In an exemplary embodiment, the form factor of the card is comparable to a secure digital (SD) card having a substantially rectangular dimensional planform of about 24 by 32 mm with a thickness of about 2-3 mm. The card includes the necessary communications elements for a wireless communications system such as Personal HandyPhone System (PHS), Code Division Multiple Access (CDMA), Global System for Mobile communications (GSM), WiMax, wireless LAN, Digital Video Broadcast—Handheld (DVB-H) or Universal Mobile Telecomunications System (UMTS), including single or multiband.

Card 10 incorporates a first connector moiety 12 which incorporates a plurality of contact pads 14. The contact pads of the first moiety for the embodiment shown include elongated pads 16 for the RF signal connector elements. The first embodiment shown in FIGS. 1A and 1B is optimized for use with an Elastomeric connector as will be described with respect to FIG. 2. Covers for the card, 19a and 19b protect the card components. The card also incorporates alignment holes 18a, 18b and 18c, best seen in FIG. 1B for engagement of mating alignment elements to be described in greater detail subsequently.

Figure 1C:
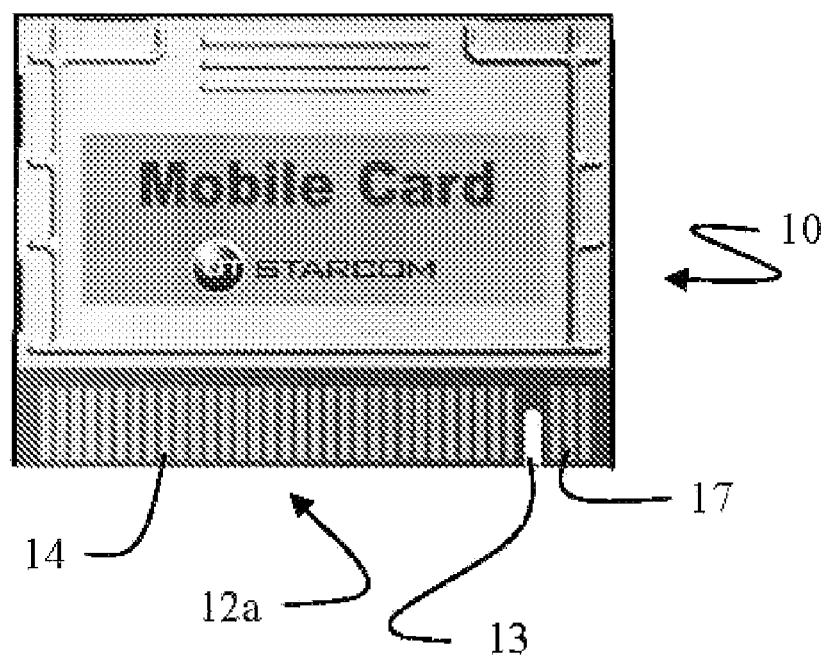
FIG. 1C demonstrates an alternative embodiment of the connector arrangement for the miniaturized form factor card.

FIG. 1C demonstrates an alternative first connector moiety for the miniaturized form factor card using an edge connector arrangement. Connector moiety 12a is received in a second connector moiety on the printed circuit board of the mobile information device. For the edge connector employed in this embodiment, an indexing slot 13 provides alignment and segregation of the RF connector contacts 17.

Figure 2:
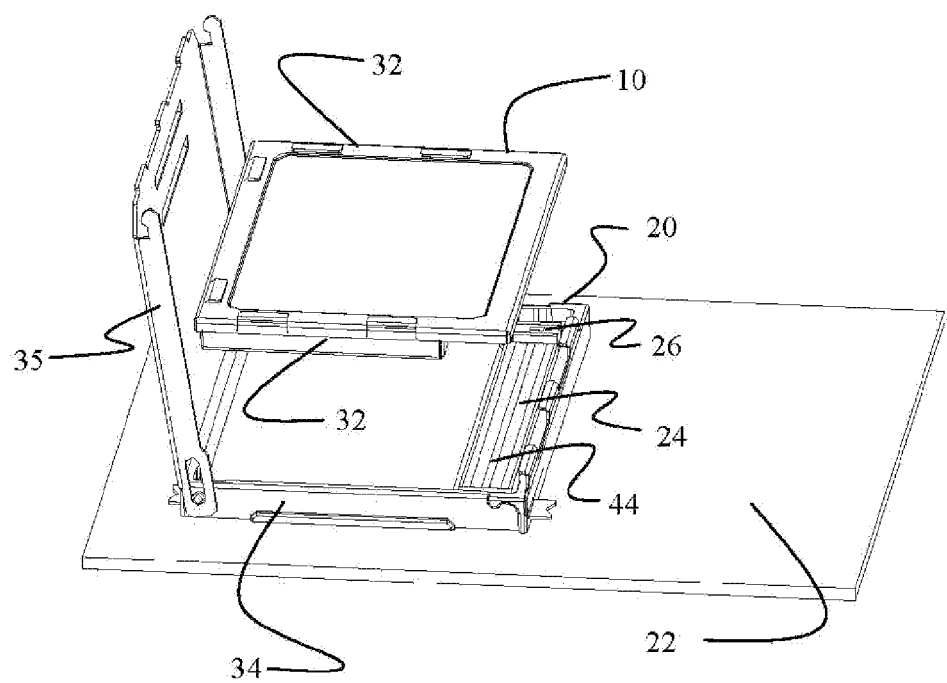
FIG. 2 is an isometric top view of a miniaturized form factor card and the receiving frame with closure element as mounted on a PC board of a Mobile Information Device employing a connector system according to the present invention.

An isometric exploded view of the card positioned for installation and the mounting frame 20 on the printed circuit board 22 of the mobile information device in which the card is to be installed is provided in FIG. 2. The connector system according to the present invention provides indexing arrangements for simplified installation such that mobile interface device designers can provide a common platform for multiple systems without custom design of the communication electronics. The installation is accomplished by the end user in certain operational scenarios. Card 10 is received within the frame mounted to PC board 22 in the MID handset. A second connector moiety, which for the embodiment shown in FIG. 2 is a first elastomeric connector 24 for digital signals and a second elastomeric connector 26 for RF signals, is mounted in the frame to receive the contact pads of the first connector moiety. An exemplary elastomeric connector is a STAX™ connector produced by Tyco Electronics. For the digital signals connector, a STAX™ model LD connector is employed in exemplary embodiments.

The card is installed in the mobile device, for the embodiment of the connector system shown in FIG. 2, by insertion vertically within frame 20 which receives the external edges 32 of the card. The connector arrangement and location provides an initial indexing for connection orientation of the card in the frame. Opposing side edges 34 of the frame provide rough alignment of the card within the frame for engagement of the connector moieties. A hinged cover 35 is provided on the frame to secure the entire card within the frame after insertion, urging the connector moieties into firm engagement.

The alignment elements of the card, frame and PC Board provide the precision alignment for the electrically contacting elements of the connector system. Alignment elements 18a, 18b and 18c on the card and the mating alignment elements on the frame align pads 14 and 16 in the connector moiety on the card with the conductive elements 44 in the elastomeric connectors secured within the frame.

Figure 3:
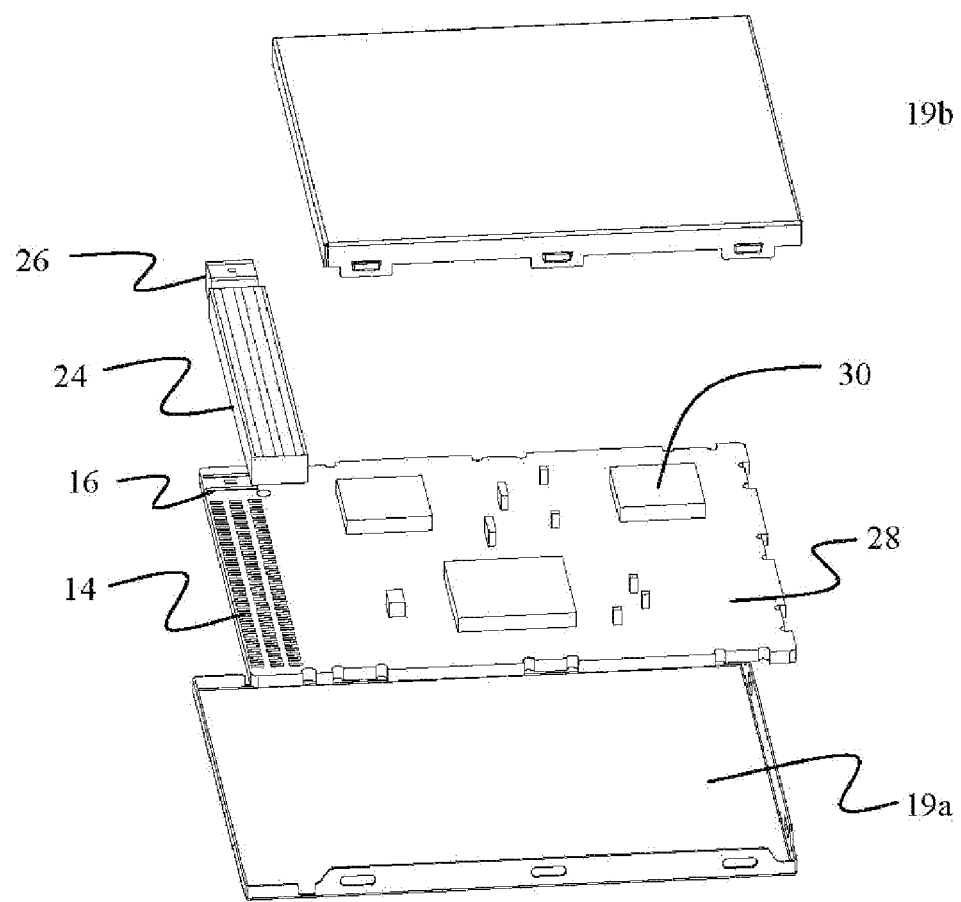
FIG. 3 is an exploded isometric bottom view of the case halves and the internal board and components of the miniaturized form factor card showing the Elastomeric connector mating elements on the card.

FIG. 3 shows a bottom isometric view of the miniaturized form factor card with first surface cover 19a and second surface cover 19b exploded from printed circuit board 28 in the card. The various components of the card represented nominally by the element number 30 are shown for basic reference only. The connector moiety adjacent a first end of the card exposed from the second surface cover includes conductive pads 14 and 16 for engagement with the mating moiety provided by conductors 44 in the Elastomeric connectors 24 and 26 (shown for reference).

Figure 4:
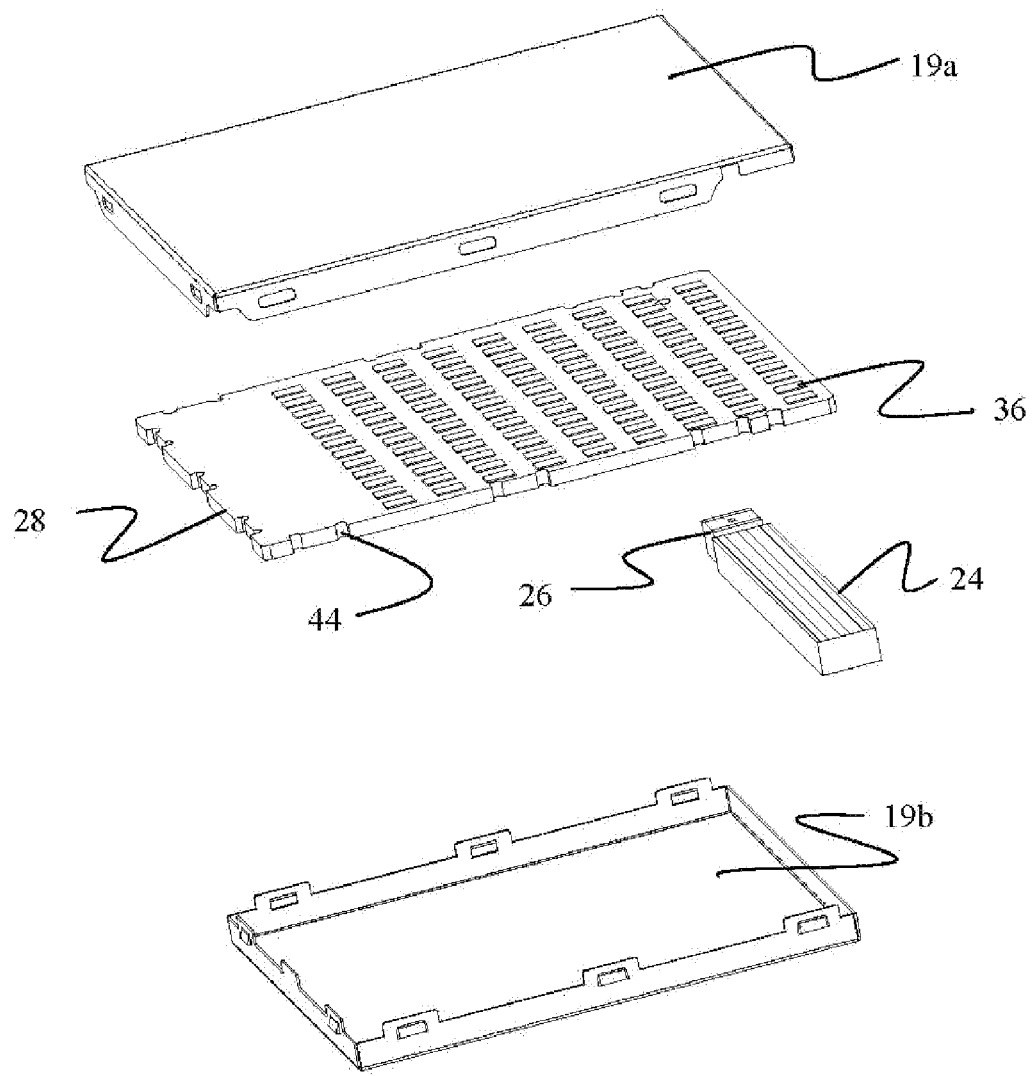
FIG. 4 is an exploded isometric top view of the case halves and the internal components of the miniaturized form factor card showing the solder connection pads on the card.
Figure 5A:
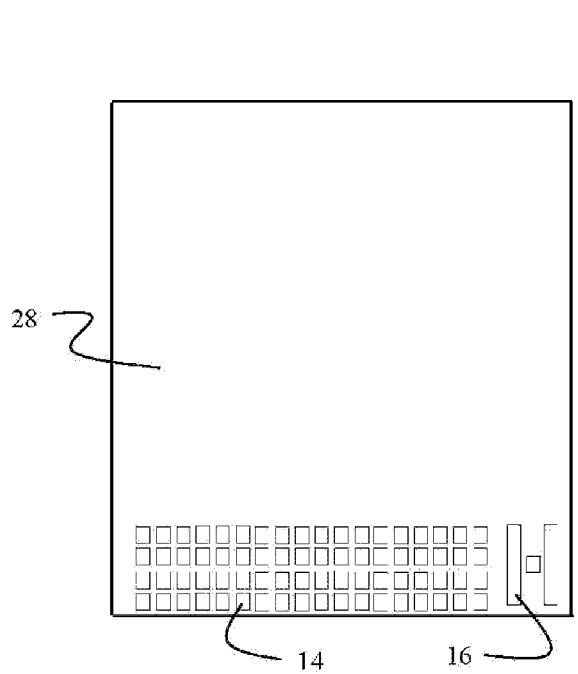
FIGS. 5A and 5b are a top and bottom view of the internal board of the card.
Figure 5B:
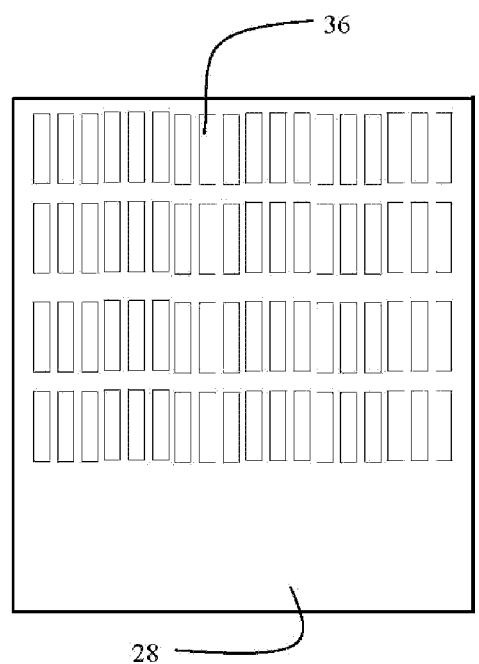

FIG. 4 shows a top isometric view of the card with first surface cover 19a and second surface cover 19b exploded from the printed circuit board. As shown, the second surface of the PC board in the card provides a plurality of solder pads 36 as an alternative for permanent connection of the card to the printed circuit board in the mobile information device. For the embodiment shown, cover 19a isolates the solder pads for applications of the card where the solder pads will not be in use. Details of the contact pads of the connector moiety on the second surface of the card adjacent the first edge and the solder connection pads on the first surface of the card are shown in FIGS. 5A and 5B respectively. Location of the connector moiety at one end of the second surface of the card provides sufficient area for mounting of the operational components of the card on the remaining portion of the second surface. The larger surface area of the solder pads on the first surface of the card for the first embodiment shown in FIG. 5B allows adequate area for wave soldering or other techniques for attachment.

Figure 6:
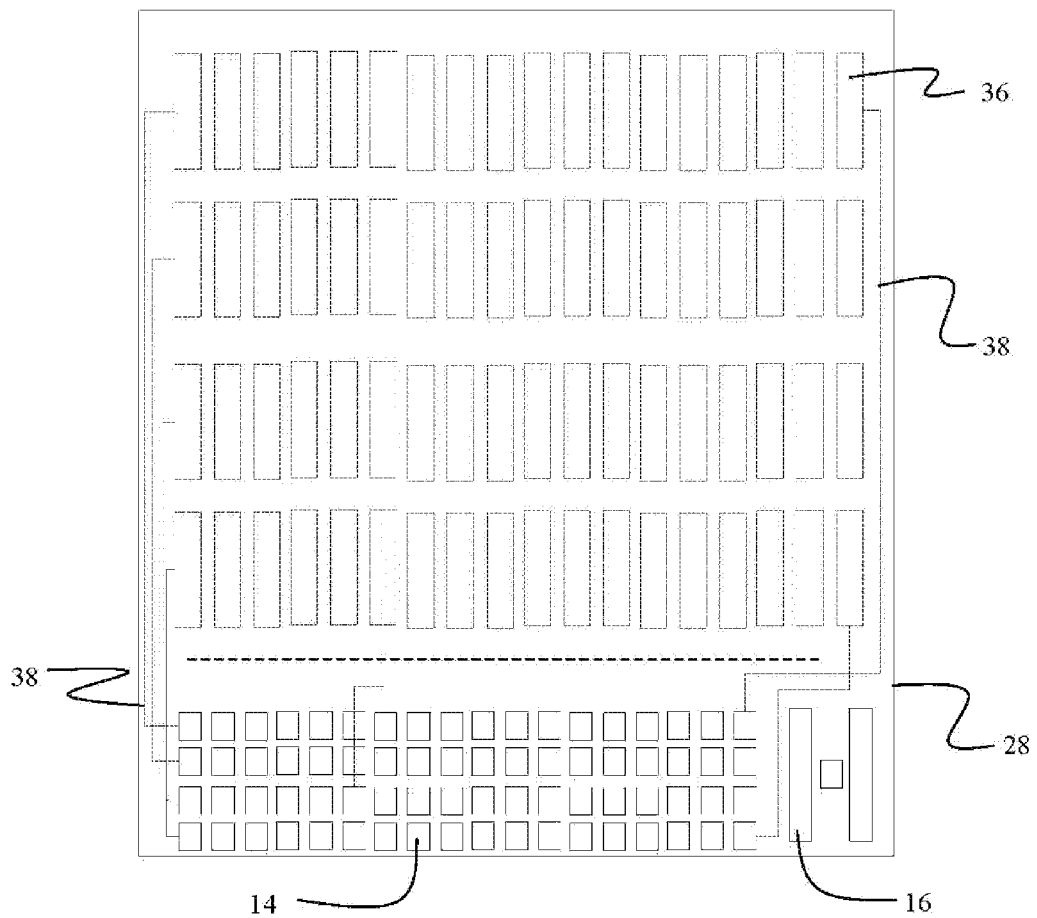
FIG. 6 is a bottom view of the card with the solder connection pads shown in phantom with connection busses to the Elastomeric connector mating elements.

FIG. 6 shows the second surface of the card with the conductive pads of the connector moiety. The connection pads of the solder pad array are shown in phantom with exemplary interconnection busses 38 which interconnect the contact pad and solder pad for the respective operable card connection (not all buses shown for drawing simplicity). These interconnection busses allow use of either connection option without modification or alteration of the card.

Figure 7:
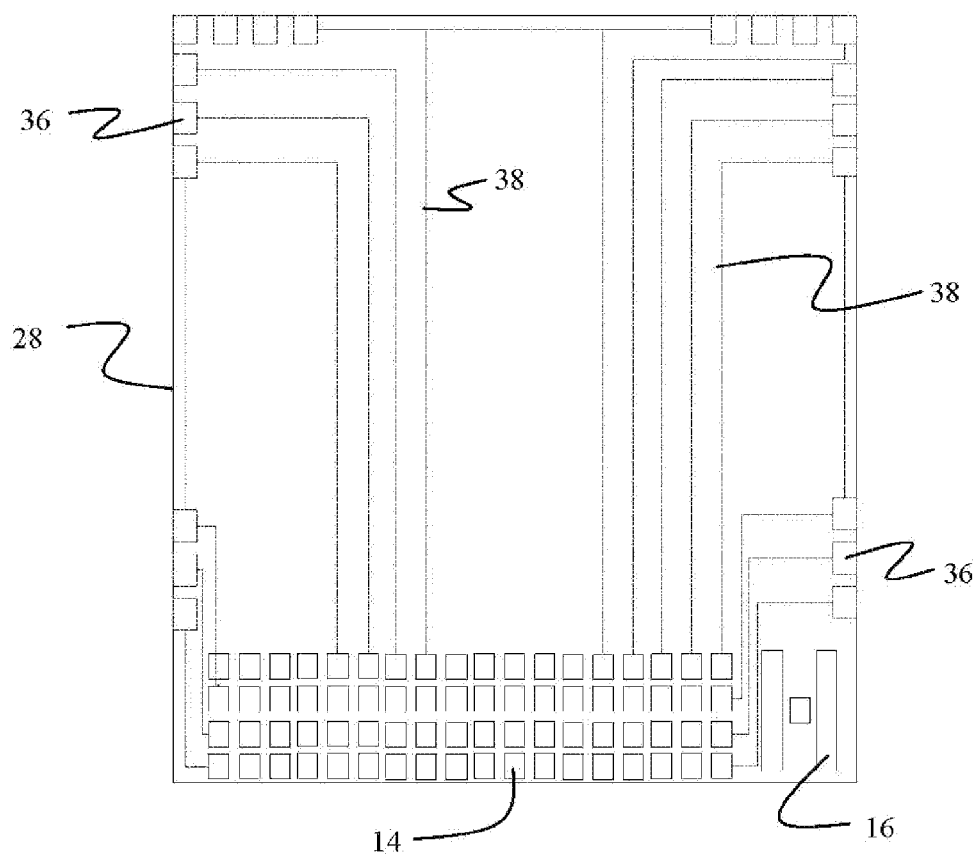
FIG. 7 is a bottom view of an alternative embodiment of the internal board of the card with the solder connection pads shown in phantom with connection busses to the Elastomeric connector mating elements; and, FIG. 8 is an exploded side section view of the card and PCB of the mobile information device showing installation of the card for solder connection.

FIG. 7 shows an alternative embodiment of the present invention in which the solder pads are provided at the edges of the PC board in the miniaturized form factor card.

Figure 8:
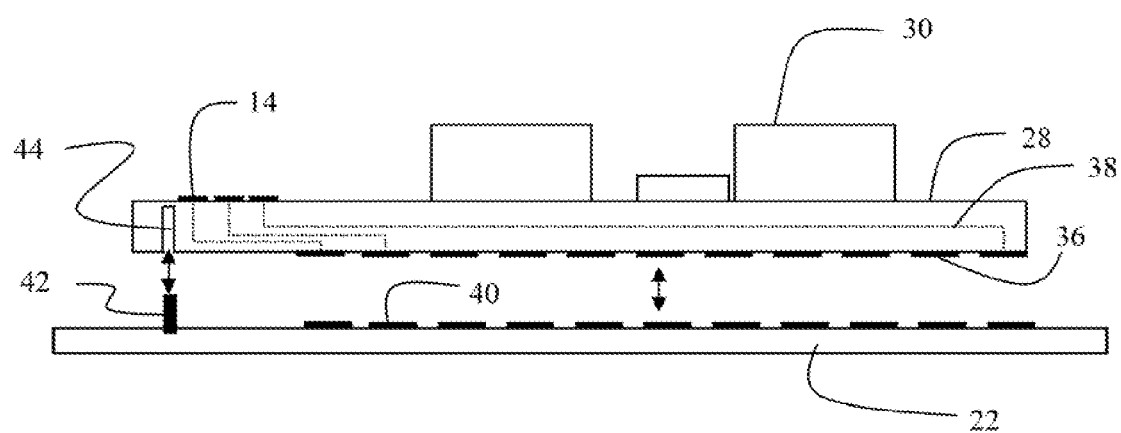

To employ the miniaturized form factor card in an end user or convertible mobile information device scenario, the card is used with the covers on the first and second surface in place. The card is inserted into the frame on the MID PC board using the alignment elements in the frame and on the card to properly engage the connector moieties with the contact pads on the card aligned with the Elastomeric connector elements. For the application shown in the drawings, the rotating cover on the frame is then positioned to secure the card in the MID. For use in a permanent installation scenario, the first and second surface covers are removed from the printed circuit board of the miniaturized form factor card (or not originally installed). As shown in FIG. 8, solder pads 36 on the card are aligned with mating pads 40 using one or more alignment posts 42 on printed circuit board 22 in the mobile information device, the posts received in slots or grooves 44 on printed circuit board 28 of the card.

Having now described the invention in detail as required by the patent statutes, those skilled in the art will recognize modifications and substitutions to the specific embodiments disclosed herein. Such modifications are within the scope and intent of the present invention as defined in the following claims.

What is claimed is:

1. A connection system for insertable miniaturized form factor cards comprising:
    a first connector moiety having a plurality of contact pads integrated onto a miniaturized form factor card to be received in a frame mounted to a printed circuit board (PCB) in a first mobile information device (MID), the frame having a second connector moiety for operable engagement of the first connector moiety upon insertion of the miniaturized form factor card into the frame, said second connector moiety engaging the contact pads on the miniaturized form factor card; and
    a plurality of solder pads integrated onto the miniaturized form factor card to alternatively be permanently attached to a mating plurality of solder pads integrated on a PCB in a second MID.

2. The connector system as defined in claim 1 further comprising means for securing the miniaturized form factor card in the frame element.

3. The connector system as defined in claim 2 in which the securing means comprises a cover connected to a first end of the frame and rotatable from a first open position for insertion of the miniaturized form factor card to a second closed position.

4. The connector system as defined in claim 1 wherein the second connector moiety is an elastomeric connector.

5. The connector system as defined in claim 1 wherein the contact pads are placed on a first surface of the miniaturized form factor card and the solder pads are placed on a second surface of the miniaturized form factor card.

6. The connector system as defined in claim 5 further comprising means for alignment of the plurality of solder pads and plurality of mating solder pads.

7. A connection system for insertable miniaturized form factor cards comprising:
    a first connector moiety having a plurality of contact pads integrated onto a miniaturized form factor card, the miniaturized form factor card having a first plurality of alignment elements for alignment of the first connector moiety;
    a frame sized to receive the miniaturized form factor card and mounted to a printed circuit board (PCB) in a mobile information device (MID);
    means for securing the miniaturized form factor card upon insertion into the frame;
    a second connector moiety constrained within the frame for operable engagement of the first connector moiety upon insertion of the miniaturized form factor card into the frame, said second connector moiety engaging the contact pads;
    a plurality of solder pads integrated onto the miniaturized form factor card to alternatively be permanently attached to a mating plurality of solder pads integrated on a PCB in a second MID; and
    means for alignment of the plurality of solder pads and plurality of mating solder pads.

8. The connector system as defined in claim 7 wherein the plurality of solder pads are arranged on edges of the miniaturized form factor card.

9. The connector system as defined in claim 7 wherein the second connector moiety is an elastomeric connector.

10. The connector system as defined in claim 7 wherein the contact pads are placed on a first surface of the miniaturized form factor card and the solder pads are placed on a second surface of the miniaturized form factor card.

11. The connector system as defined in claim 10 further comprising a first cover secured over the first surface of the miniaturized form factor card, said first cover sized to expose the contact pads of first connector moiety.

12. The connector system as defined in claim 11 further comprising a second cover removably secured over the second surface of the miniaturized form factor card.

13. The connector system as defined in claim 7 further comprising busses interconnecting the contact pads and solder pads.

14. A connector system as defined in claim 7 wherein the first connector moiety is an edge connector.

15. A method for connecting an insertable miniaturized form factor card comprising the steps of:
    providing a miniaturized form factor card having a first connector moiety with a plurality of integrated contact pads and a plurality of solder pads;
    providing a first mobile information device (MID) to receive the miniaturized form factor card in a frame element mounted to a printed circuit board (PCB), the frame element having a second connector moiety constrained within the frame for operable engagement of the first connector moiety;
    inserting the miniaturized form factor card into the frame, said second connector moiety engaging contact pads on the MID's PCB; and
    providing a second MID to receive the miniaturized form factor card for permanent attachment to a mating plurality of solder pads integrated on a PCB in a second MID;
    alternatively inserting the miniaturized form factor card onto the PCB in the second MID; and,
    soldering the solder pads and mating solder pads.

* * * * *